US006902985B2

(12) United States Patent
Derderian et al.

(10) Patent No.: US 6,902,985 B2
(45) Date of Patent: *Jun. 7, 2005

(54) METHOD OF FORMING A ROUGH (HIGH SURFACE AREA) ELECTRODE FROM TI AND TIN CAPACITORS AND SEMICONDUCTOR DEVICES INCLUDING SAME

(75) Inventors: Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

This patent is subject to a terminal disclaimer.

(21) Appl. No.: 10/215,513

(22) Filed: Aug. 8, 2002

(65) Prior Publication Data

US 2002/0187607 A1 Dec. 12, 2002

Related U.S. Application Data

(62) Division of application No. 10/005,850, filed on Dec. 5, 2001, now Pat. No. 6,608,343, which is a continuation of application No. 09/353,426, filed on Jul. 15, 1999, now Pat. No. 6,399,982, which is a continuation of application No. 08/887,915, filed on Jul. 2, 1997, now Pat. No. 6,188,097.

(51) Int. Cl.$^7$ ............................................. H01L 21/20
(52) U.S. Cl. ...................... 438/398; 438/396; 438/255; 438/653
(58) Field of Search ................................. 438/398, 396, 438/255, 653, 654, 655

(56) References Cited

U.S. PATENT DOCUMENTS

| RE28,635 E | 12/1975 | Youtsey et al. |
|---|---|---|
| 4,438,481 A | 3/1984 | Phillips et al. |
| 5,005,102 A | 4/1991 | Larson |
| 5,061,650 A | 10/1991 | Dennison et al. |
| 5,087,296 A | * 2/1992 | Kondo et al. ............... 136/258 |
| 5,112,773 A | 5/1992 | Tuttle |
| 5,182,232 A | 1/1993 | Chhabra et al. |
| 5,292,677 A | 3/1994 | Dennison |
| 5,326,724 A | 7/1994 | Wei |
| 5,338,700 A | 8/1994 | Dennison et al. |
| 5,340,763 A | 8/1994 | Dennison |
| 5,340,765 A | 8/1994 | Dennison et al. |
| 5,362,666 A | 11/1994 | Dennison |
| 5,418,180 A | 5/1995 | Brown |

(Continued)

OTHER PUBLICATIONS

*Handbook of Thin Film Technology*, L.I. Maissel & R. Glang (McGraw–Hill 1970) [pp. 8–28, 8–31].
*Silicon Processing for the VLSI Era: vol. 1—Process Technology*, S. Wolf & R. N. Tauber (Lattice Press 1986) [pp. 110, 112, 114].
*An Introduction to Thin Films*, L.I. Maissel & M.H. Francombe (Gordon & Breach 1973) [pp. 80, 81].
Ruska, W.S., "Microelectronic Processing, An Introduction to the Manufacture of Integrated Circuits," (1987) pp. 278–279.

*Primary Examiner*—Amir Zarabian
*Assistant Examiner*—Christy Novacek
(74) *Attorney, Agent, or Firm*—TraskBritt

(57) ABSTRACT

A technique for forming a high surface area electrode or storage node for a capacitor and devices formed thereby, including depositing a first layer of conductive material on a substrate, such that a discontinuous layer is formed. A second conductive material layer is deposited over the discontinuous first conductive material layer, such that the second conductive material layer grows or accumulates on the discontinuous first conductive material layer at a faster rate than on the exposed areas of the substrate in the discontinuous first conductive material layer to form a rough conductive material layer.

20 Claims, 7 Drawing Sheets

U.S. PATENT DOCUMENTS

| | | |
|---|---|---|
| 5,444,022 A | 8/1995 | Gardner |
| 5,457,063 A | 10/1995 | Park |
| 5,459,094 A | 10/1995 | Jun |
| 5,466,626 A | 11/1995 | Armacost et al. |
| 5,491,356 A | 2/1996 | Dennison et al. |
| 5,494,841 A | 2/1996 | Dennison et al. |
| 5,508,223 A | 4/1996 | Tseng |
| 5,508,542 A | 4/1996 | Geiss et al. |
| 5,552,334 A | 9/1996 | Tseng |
| 5,589,712 A | 12/1996 | Kawashima et al. |
| RE35,420 E | 1/1997 | Cathey et al. |
| 5,622,888 A | 4/1997 | Sekine et al. |
| 5,627,102 A | 5/1997 | Shinriki et al. |
| 5,654,581 A | 8/1997 | Radosevich et al. |
| 5,700,710 A | 12/1997 | Zenke |
| 5,705,838 A | 1/1998 | Jost et al. |
| 5,719,083 A * | 2/1998 | Komatsu .................... 438/652 |
| 5,753,948 A | 5/1998 | Nguyen et al. |
| 5,760,434 A | 6/1998 | Zahurak et al. |
| 5,760,474 A | 6/1998 | Schuele |
| 5,811,344 A | 9/1998 | Tu et al. |
| 5,817,554 A | 10/1998 | Tseng |
| 5,847,459 A | 12/1998 | Taniguchi |
| 5,885,882 A | 3/1999 | Schugraf et al. |
| 5,946,594 A | 8/1999 | Iyer et al. |
| 6,033,928 A * | 3/2000 | Eriguchi et al. ............... 438/42 |
| 6,069,053 A * | 5/2000 | Ping et al. .................. 438/398 |
| 6,188,097 B1 | 2/2001 | Derderian et al. |
| 6,350,648 B1 | 2/2002 | Ping et al. |
| 6,399,982 B1 | 6/2002 | Derderian et al. |

\* cited by examiner

METHOD OF FORMING A ROUGH (HIGH SURFACE AREA) ELECTRODE FROM TI AND TIN CAPACITORS AND SEMICONDUCTOR DEVICES INCLUDING SAME

CROSS-REFERENCE TO RELATED APPLICATIONS

This application is a divisional of application Ser. No. 10/005,850, filed Dec. 5, 2001, now U.S.Pat. No. 6,608,343, issued Aug. 19, 2003, which is a continuation of application Ser. No. 09/353,426, filed Jul. 15, 1999, now U.S. Pat. No. 6,399,982, issued Jun. 4, 2002, which is a continuation of application Ser. No. 08/887,915, filed Jul. 2, 1997, now U.S. Pat. No. 6,188,097, issued Feb. 13, 2001.

BACKGROUND OF THE INVENTION

1. Field of the Invention

The present invention relates to a semiconductor memory device and method of fabricating same. More particularly, the present invention relates to capacitor fabrication techniques applicable to dynamic random access memories (DRAMs) capable of achieving high capacitor capacitance by forming high surface area electrodes or storage nodes.

2. State of the Art

A widely-utilized DRAM (Dynamic Random Access Memory) manufacturing process utilizes CMOS (Complementary Metal Oxide Semiconductor) technology to produce DRAM circuits which comprise an array of unit memory cells, each including one capacitor and one transistor, such as a field effect transistor (FET). In the most common circuit designs, one side of the transistor is connected to external circuit lines called the bit line and the word line, and the other side of the capacitor is connected to a reference voltage that is typically ½ the internal circuit voltage. In such memory cells, an electrical signal charge is stored in a storage node of the capacitor connected to the transistor which charges and discharges circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieved ever higher degrees of integration which has reduced the size of the DRAM. However, as the dimensions of the DRAM are reduced, the occupation area of each unit memory cell of the DRAM must be reduced. This reduction in occupied area necessarily results in a reduction of the dimensions of the capacitor, which in turn, makes it difficult to ensure required storage capacitance for transmitting a desired signal without malfunction. However, the ability to densely pack the unit memory cells while maintaining required capacitance levels is a crucial requirement of semiconductor manufacturing technologies if future generations of DRAM devices are to be successfully manufactured.

In order to minimize such a decrease in storage capacitance caused by the reduced occupied area of the capacitor, the capacitor should have a relatively large surface area within the limited region defined on a semiconductor substrate. The drive to produce smaller DRAM circuits has given rise to a great deal of capacitor development. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly."

A variety of methods is used for increasing the surface area of a capacitor. These methods include forming the capacitor with various three-dimensional shapes extending from the capacitor. These three-dimensional shapes include fins, cylinders, and cubes. U.S. Pat. No. 5,457,063 issued Oct. 10, 1995 to Park and U.S. Pat. No. 5,459,094 issued Oct. 17, 1995 to Jun each teach methods for fabricating such three-dimensional shaped capacitors for memory cells. However, as with other known fabrication methods, these methods require numerous complex steps in forming the capacitors.

Another method used for increasing the surface area of a capacitor includes forming rough or irregular storage node or electrode surfaces. Commonly-owned U.S. Pat. Nos. 5,494,841, 5,340,765, 5,340,763, 5,338,700, hereby incorporated herein by reference, each teach forming a rough surface on the capacitor storage node by depositing a hemispherical grain polysilicon on the capacitor storage node, then blanket etching the hemispherical grain polysilicon (or similar technique), which forms a textured surface thereon. Although the use of such hemispherical grain polysilicon techniques is very effective for increasing the surface area of capacitor storage nodes, the techniques require numerous production steps to form the rough surfaces.

Other methods of increasing the surface area of the capacitor storage node have also been proposed. U.S. Pat. No. 5,466,626 issued Nov. 14, 1995 to Armacost et al. teaches using a micromask formed by agglomeration material, such as gold, titanium nitride, or titanium silicide on a surface of a substrate. The agglomeration material is used as a mask for selectively etching the substrate to form recesses therein to increase surface area for the subsequent formation of the storage node or electrode. U.S. Pat. No. 5,508,542 issued Apr. 16, 1996 to Geiss et al. teaches using porous silicon as a first plate of a capacitor structure which also increases the surface area for the subsequent formation of the storage node or electrode. However, both of these techniques require multiple processing steps and/or specialized materials.

Therefore, it would be desirable to increase storage cell capacitance by forming a rough or high surface area capacitor storage node (electrode) while using inexpensive, commercially-available, widely-practiced semiconductor device fabrication techniques and apparatus without requiring complex processing steps.

SUMMARY OF THE INVENTION

The present invention relates to a method of forming a high surface area capacitor, generally used in DRAMs, and resulting devices. The present invention is a novel technique for forming electrodes or storage nodes for the capacitor. The technique involves depositing a first layer of conductive material, such as titanium or the like, on a substrate. The substrate can be any structure or layer in a semiconductor device, including but not limited to silicon, dielectric materials (such as polymeric materials [polyimides]), glasses (such as spin-on-glass or other silicon-based glass including boron, phosphorous, and boron/phosphorous silicate glasses, and tetraethyl orthosilicate), and silicon nitride. The substrate may also include vias or any structures desired for the formation of a storage node.

The first conductive material, such as titanium, is deposited such that a discontinuous layer is formed wherein areas of the substrate are exposed through the discontinuous first conductive material layer. A second conductive material layer, such as titanium nitride or the like, is deposited over the discontinuous first conductive material layer. The materials used to form the first and second conductive material layers are specifically selected such that the second conductive material layer grows or accumulates on the discontinuous first conductive material layer at a faster rate than on the exposed areas of the substrate to form enlarged protrusions over the surface of the second conductive material layer, thereby increasing the capacitance of the capacitor to be formed.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–9 illustrate a technique according to the present invention for forming a capacitor for a memory cell. It should be understood that the figures presented in conjunction with this description (with the exception of FIGS. 10 and 11) are not meant to be illustrations of actual cross-sectional views of any particular portion of an actual semiconducting device, but are merely idealized representations which are employed to more clearly and fully depict the process of the invention than would otherwise be possible.

Figure 1:
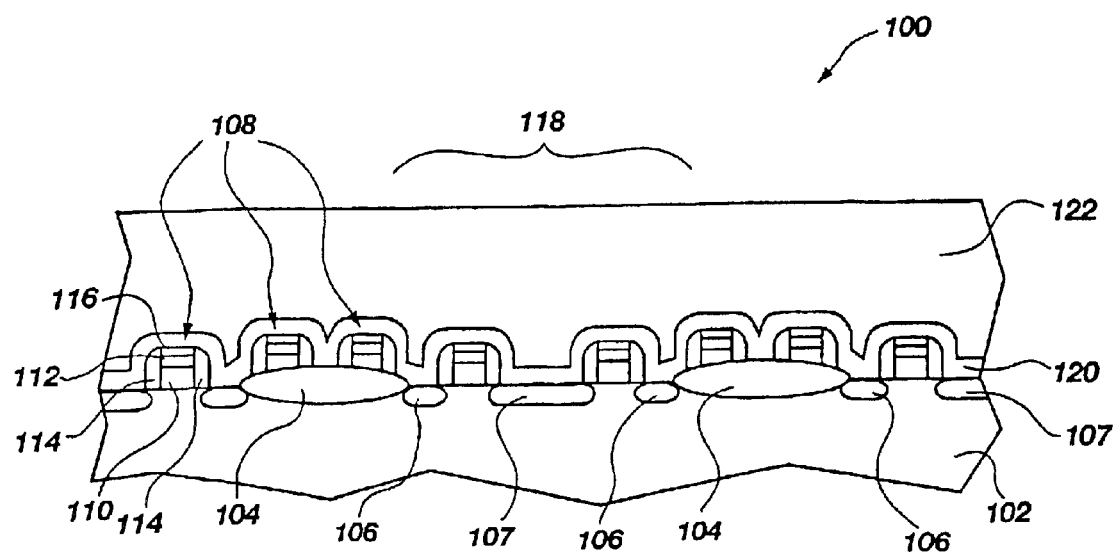
FIGS. 1–9 are side cross-sectional views of a method of forming a memory cell capacitor according to the present invention.

FIG. 1 illustrates an intermediate structure 100 in the production of capacitors for a memory cell. This intermediate structure 100 comprises a semiconductor substrate 102, such as a lightly doped P-type crystal silicon substrate, which has been oxidized to form thick field oxide areas 104 and exposed to implantation processes to form drain regions 106 and source regions 107. Transistor gate members 108 are formed on the surface of the semiconductor substrate 102, including the gate members 108 residing on a substrate active area 118 spanned between the drain regions 106 and the source regions 107.

The transistor gate members 108 each comprise a lower buffer layer 110, preferably silicon dioxide or silicon nitride, separating a gate conducting layer or wordline 112 of the transistor gate member 108 from the semiconductor substrate 102. Transistor insulating spacer members 114, preferably silicon nitride, are formed on either side of each transistor gate member 108 and a cap insulator 116, also preferably silicon nitride, is formed on the top of each of the transistor gate members 108. A first barrier layer 120, preferably tetraethyl orthosilicate—TEOS, is disposed over the semiconductor substrate 102, the thick field oxide areas 104, and the transistor gate members 108. A second barrier layer 122 (preferably made of borophosphosilicate glass—BPSG, phosphosilicate glass—PSG, or the like) is deposited over the first barrier layer 120.

It is, of course, understood that a single barrier layer could be employed. However, a typical barrier configuration is a layer of TEOS over the transistor gate members 108 and the substrate 102 followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions, which can adversely affect the performance of the memory cell.

Figure 2:
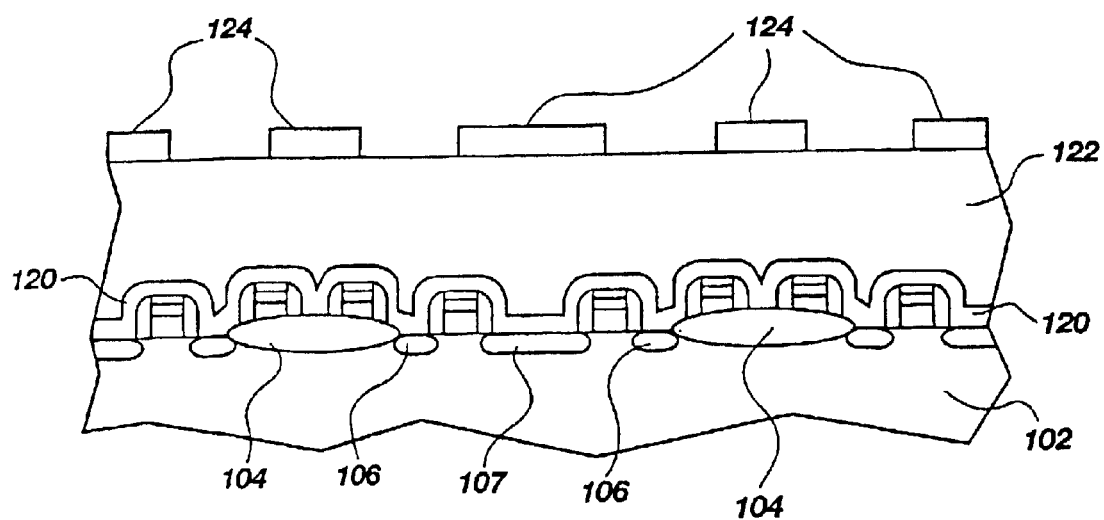
Figure 3:
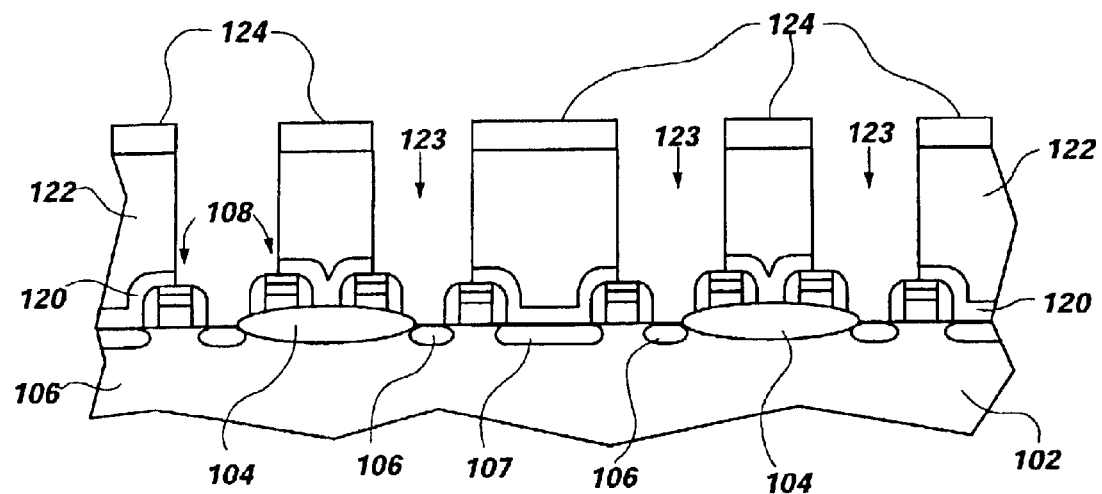

As shown in FIG. 2, a resist material 124 is patterned on the second barrier layer 122, such that predetermined areas for subsequent memory cell capacitor formation will be etched. The second barrier layer 122 and the first barrier layer 120 are etched to form vias 123 to expose the drain regions 106 on the semiconductor substrate 102, as shown in FIG. 3. The transistor insulating spacer members 114 and the cap insulator 116, each being made of silicon nitride, resist the etchant and thus prevent shorting between the word line 112 and the capacitor to be formed.

Figure 4:
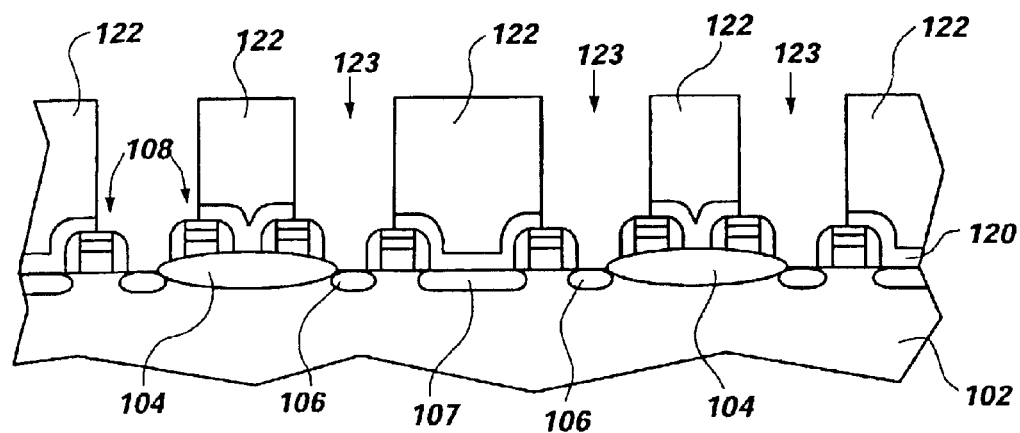
Figure 5:
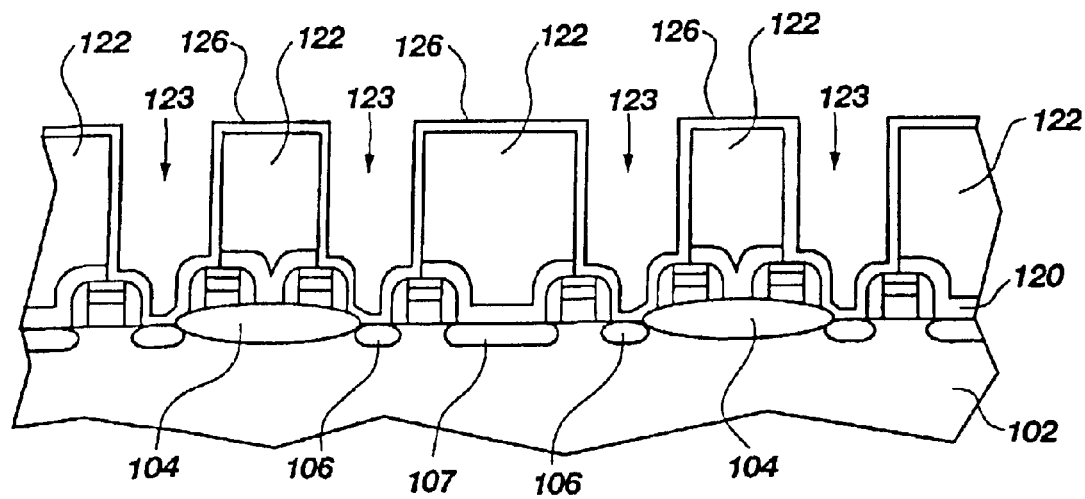
Figure 9:
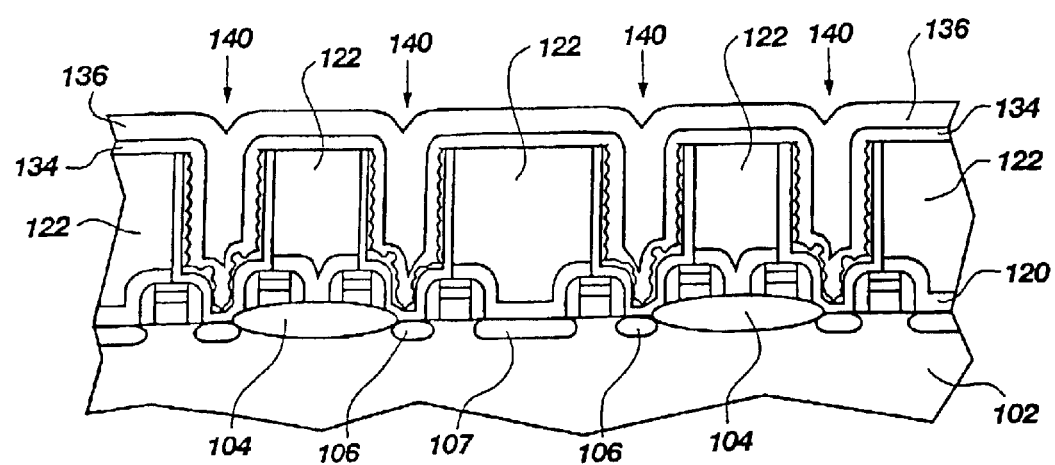
Figure 10A:
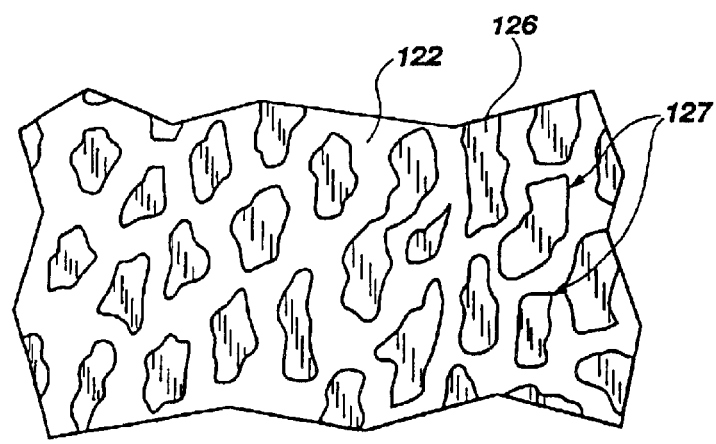
FIGS. 10a–10c are illustrations of plan views of possible variations in the structure of discontinuous conductive material layers applied on a barrier layer via according to the present invention.
Figure 10B:
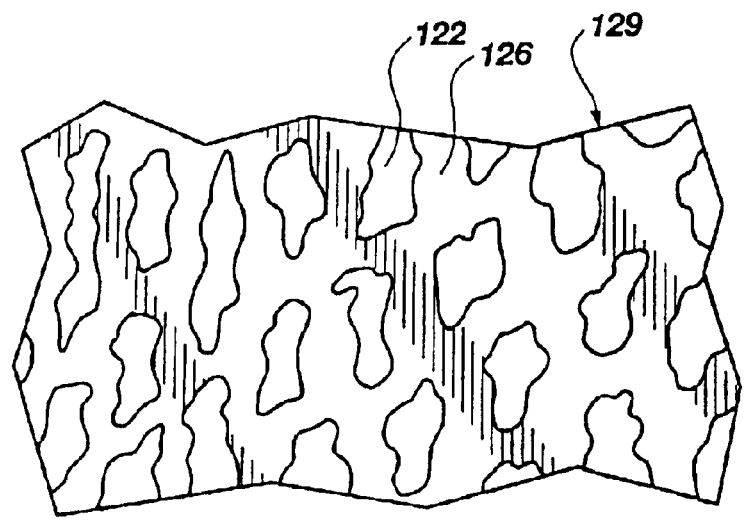
Figure 10C:
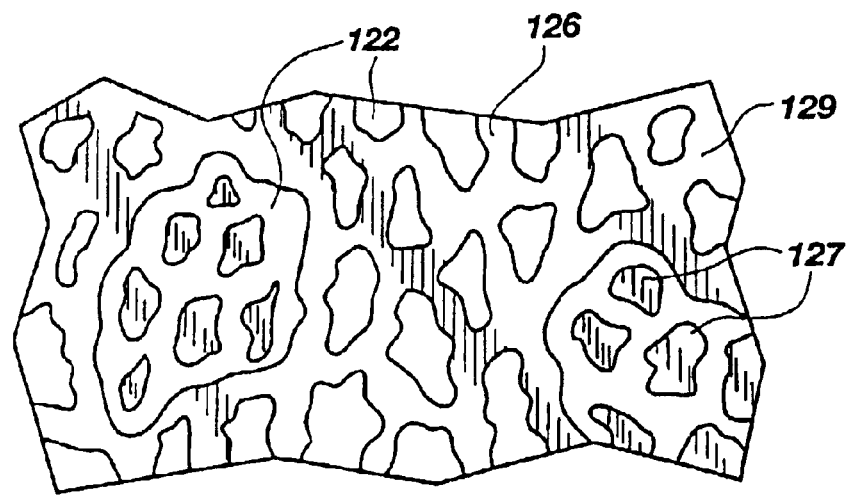

The resist material 124 is then removed, as shown in FIG. 4, and a layer of first conductive material 126, preferably titanium, is then applied over second barrier layer 122, preferably by sputtering or chemical vapor deposition, as shown in FIG. 5. The first conductive material layer 126 makes contact with each drain region 106 of the semiconductor substrate 102. Although the first conductive material layer 126 is shown as continuous for illustrative purposes in FIGS. 5–9, the layer of first conductive material 126 and second barrier layer 122 are specifically selected to result in the first conductive material layer 126 being discontinuous within the vias 123. The discontinuous nature of the first conductive material layer 126 is illustrated in FIGS. 10a–10c which illustrate plan views of possible variations in the structure of the first conductive material layer 126 atop the second barrier layer 122 within the vias 123. FIG. 10a illustrates a first conductive material layer 126 which is substantially unconnected, wherein the first conductive material layer 126 forms islands 127. FIG. 10b illustrates a first conductive material layer 126 which is connected, wherein the first conductive material layer 126 forms a webbing 129. FIG. 10c illustrates a first conductive material layer 126 which has both areas of webbing 129 and of islands 127.

Figure 6:
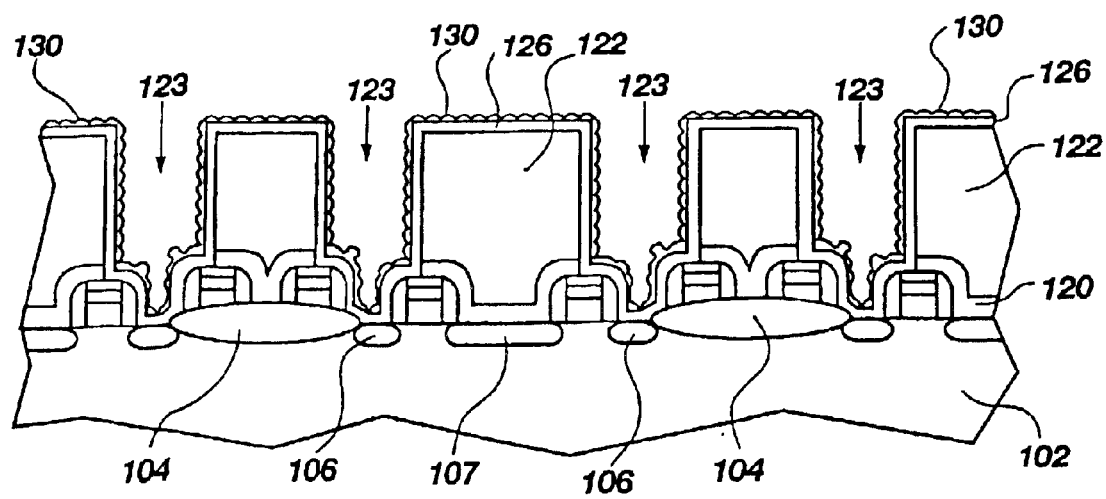

A second conductive material 130, preferably titanium nitride, is deposited over the first conductive material layer 126 (as well as, any exposed areas of the second barrier layer 122 in the discontinuous first conductive material layer 126 within the via 123). The first conductive material layer 126 and the second conductive material 130 are specifically selected such that the second conductive material 130 grows or accumulates on the discontinuous first conductive material layer 126 within the via 123 at a faster rate than on the exposed areas of the second barrier layer 122 in the discontinuous first conductive material layer 126 within the via. The second conductive material layer 130 by its selective deposition forms enlarged protrusions over its surface, as shown in FIG. 6.

Although the first conductive material layer 126 is preferably titanium and the second conductive material layer 130 is preferably titanium nitride, it is understood that any two conductive materials could be used in combination, as long as the second conductive material grows faster on the first conductive material than on the material layer underneath the first conductive material. It is also understood that the first conductive material could actually be non-conductive or of limited conductivity. It is further understood that the first conductive material could be the same as the second conductive material. The actual first conductive material and the second conductive material used will depend on the type of dielectric used for the barrier layer(s) of the cells and the amount and conditions of anneals that the structure will be exposed to. Possible alternate materials include Pt, PtRh, $RuO_2$, $SrRuO_2$, Ir, $IrO_2$, NiCr, W, WN, $WSi_2$, Mo, MoN, Ta, TaN, $TaSi_2$, $TiSi_2$, and TiAlN, where Pt is platinum, Rh is rhodium, O is oxygen, Sr is strontium, Ir is iridium, Ni is nickel, Cr is chromium, W is tungsten, N is nitrogen, Si is silicon, Mo is molybdenum, Ta is tantalum, and Al is aluminum.

Figure 7:
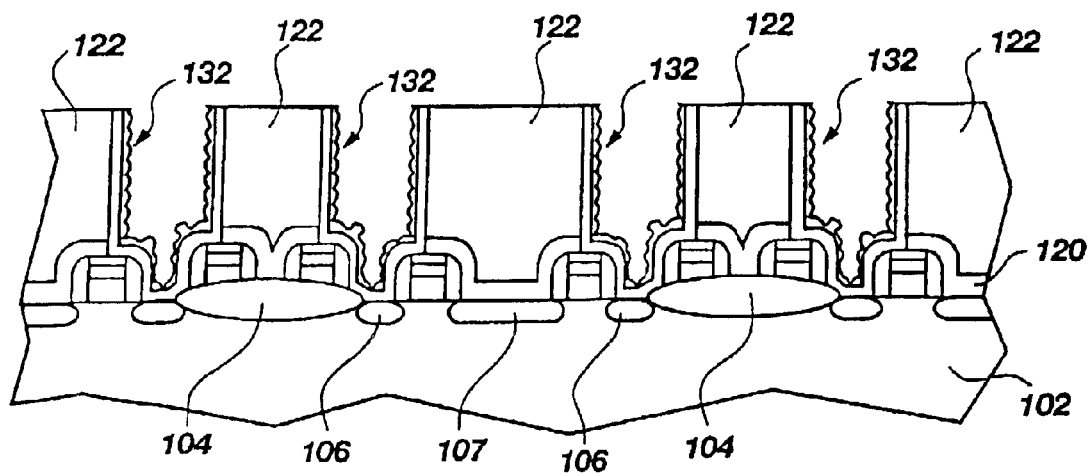

The second conductive material layer 130 and first conductive material layer 126 are then planarized down to the second barrier layer 122 to form storage nodes 132, as shown in FIG. 7. The planarization is preferably performed using a mechanical abrasion, such as a chemical mechanical planarization (CMP) process.

Figure 8:
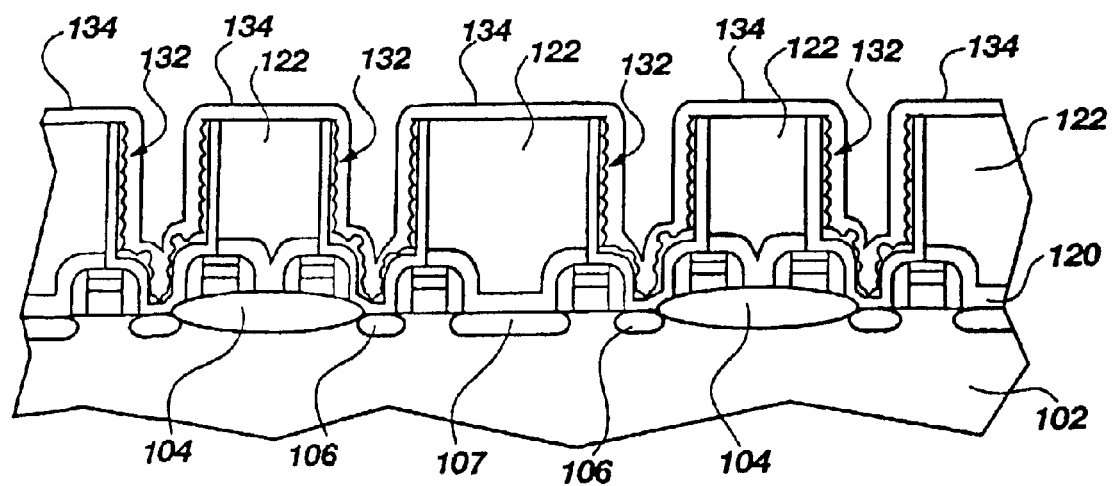

A cell dielectric layer 134 is deposited over the storage nodes 132 and exposed areas of the second barrier layer 122, as shown in FIG. 8. As shown in FIG. 9, capacitors 140 are formed by depositing a capacitor conductive layer 136 over the cell dielectric layer 134. The capacitors 140 are, as illustrated, part of a memory array which is a part of a standard random access memory chip.

EXAMPLE

Figure 11:
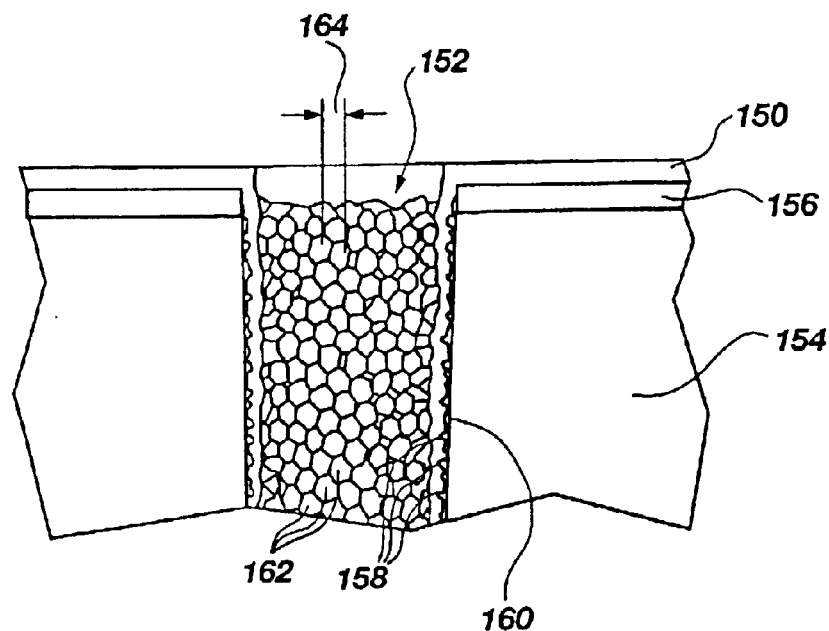
FIG. 11 is an illustration of a scanning electron micrograph of a rough conductive material layer formed by a method according to the present invention.
Figure 12:
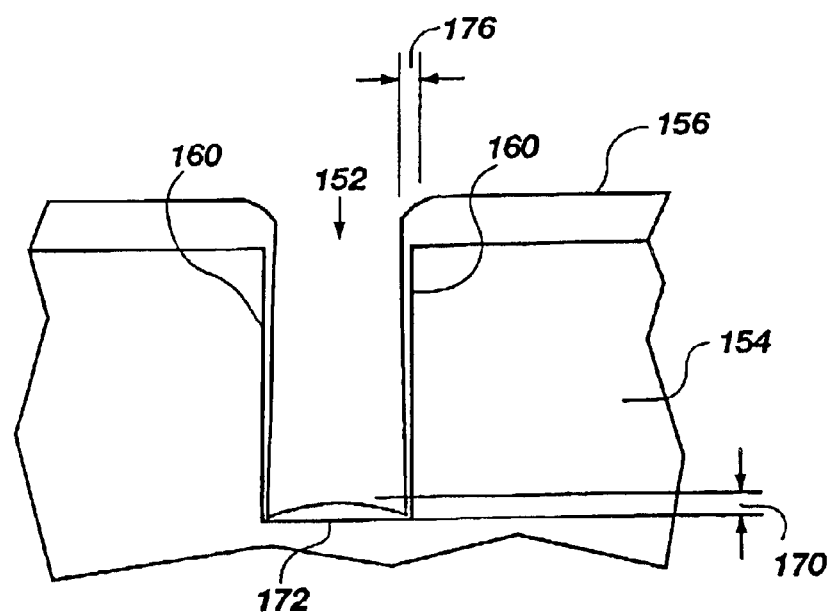
FIG. 12 is a side cross-sectional view of a conductive material within a via according to the present invention.

FIG. 11 is an illustration of a scanning electron micrograph of a rough conductive material layer within a via 152 formed as discussed above. The via 152 was etched by dry etching with a carbon and fluorine based plasma chemistry (approximately 0.4 microns wide and 2.0 microns deep) into a layer of borophosphosilicate glass 154. A layer of titanium 156 was sputtered (2.5:1 collimated sputtered with a Varian MB2 (Varian Associates, Inc., Palo Alto, Calif.)—(2.5:1 collimated refers to a multi-celled honeycombed "collimator" that is between the sputter target and the wafer in a sputter deposition system. The collimator allows only atoms that are sputtered at 90 degrees or nearly 90 degrees from making it through the collimator to the wafer. The ratio 2.5:1 refers to the ratio between height and the diameter of each honeycomb cell in the collimator.)) to a depth of about 1300 angstroms onto the borophosphosilicate glass layer 154 at a temperature of between about 300 and 400° C. and in a pressure of about 0.6 mTorr. As shown in FIG. 12, the sputtering of the titanium layer 156 to a depth of about 1300 angstroms on the borophosphosilicate glass layer 154 through the collimator results in a depth 170 of the titanium layer 154 on the bottom 172 of the via 152 to be between about 100 and 300 angstroms with less than about 100 angstroms thick 176 of the titanium layer 154 on the sidewalls 160 of the via 152.

As a result of the collimated sputtering, referring back to FIG. 11, the titanium layer 156 formed a thin discontinuous layer of titanium 158 on the sidewalls 160 of the via 152. Like results are believed to be obtainable with sputter temperatures between about 20 to 600° C., pressures of between about 0.4 mTorr and 1.0 Torr, and collimator ratios between about 0 to 3:1. It is, of course, understood that other deposition techniques, such as a chemical vapor deposition process, could also be used to form the discontinuous titanium layer 158.

A layer of titanium nitride 150 was deposited by chemical vapor deposition over the titanium layer 156 to a depth of about 500 angstroms (from tetrakis(dimethylamino)titanium "TDMAT"—$Ti(N(CH_3)_2)_4$) at a temperature of about 420° C., a pressure of about 600 mTorr, and a deposition time of about 40 seconds. The titanium nitride layer 150 deposited on the discontinuous titanium layer 158 on the via sidewalls 160 at a rate of about 20% greater than on exposed portions of the borophosphosilicate glass layer 154 on the via sidewalls 160. Like results are believed to be obtainable with a deposition temperature between about 300 and 500° C. and a pressure of between about 40 mTorr and 10 Torr. Although the chemical mechanisms and/or interactions between the borophosphosilicate glass layer 154, the discontinuous titanium layer 158, and the titanium nitride layer 150 are not completely understood, it is believed that the difference in deposition rates accounts for the resulting formation of nodules 162. The nodules 162 forming within the via 152, shown in FIG. 11, are preferably about 500 angstroms in diameter (shown as diameter 164). The formation of the nodules 162 greatly increases the surface area of the conductive layer and thereby increases the capacitance of the capacitor to be formed.

It is understood that the thickness of the discontinuous titanium layer 158 could be varied to change the degree of discontinuity of the discontinuous titanium layer 158 within the via 152 which will, in turn, change the degree of roughness, i.e., the size and shape of the nodules 162. It is known that substrate selectively (the process where a material deposits or grows faster on one material than another) would be enhanced by reducing the partial pressure of the TDMAT in the gas phase (e.g., by adding more dilutant gas, decreasing carrier gas flow, or decreasing ampule temperature) or increasing the deposition temperature (up to about 500° C.). Basically, any process change that decreases step coverage (thickness of the deposition material on the top of the barrier layer divided by the thickness of the deposition material on the bottom of the via in the barrier layer) will increase substrate selectivity.

A distinct advantage of using the technique of the present invention is that it achieves a high surface area electrode that is less susceptible to oxidation than those formed using other methods, such as depositing a hemispherical grain polysilicon on the capacitor storage node, as discussed above. Oxides of silicon have dielectric constants of about 4.4 to 4.6. If during the formation of the capacitor an oxide forms (e.g., silicon dioxide) on the silicon or the polysilicon electrode, which is common, the oxide will contribute to the capacitance of the cell as if it was another capacitor in series with the capacitor that was formed. The total capacitance of two capacitors in series is determined by the following formula:

$$1/C_{total}=1/C_1+1/C_2$$

where $C_{total}$ is the total capacitance, $C_1$ is the capacitance of the first capacitor, and $C_2$ is the capacitance of the second capacitor. Thus, when a low dielectric material such as an oxide of silicon is added to a circuit, the total capacitance of the circuit is significantly reduced.

It is, of course, understood that the present invention is not limited to any single technique for forming the memory cell capacitor. For example, one skilled in the art could extend the teaching of this disclosure to form trench capacitors, or other structures which require a high surface area conductive material.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming a capacitor storage node, the method comprising:
    depositing a discontinuous first material layer on a substrate so as to define at least one area through which the substrate is exposed;
    depositing a substantially continuous second material layer over the discontinuous first material layer and the at least one area through which the substrate is exposed such that the substantially continuous second material layer exhibits a first thickness over the discontinuous first material layer and a second, lesser thickness over the at least one area through which the substrate is exposed.

2. The method according to claim 1, wherein depositing a discontinuous first material layer includes depositing a conductive discontinuous first material layer.

3. The method according to claim 1, wherein depositing a discontinuous first material layer includes depositing a semiconductive discontinuous first material layer.

4. The method according to claim 1, wherein depositing a discontinuous first material layer includes depositing a nonconductive discontinuous first material layer.

5. The method according to claim 1, wherein depositing a discontinuous first material layer includes collimated sputtering.

6. The method according to claim 5, wherein the collimated sputtering further includes defining a collimator ratio to be less than approximately 3:1.

7. The method according to claim 1, wherein depositing a discontinuous first material layer includes chemical vapor deposition of the discontinuous first material layer.

8. The method according to claim 1, further comprising forming the discontinuous first material layer and the substantially continuous second material layer out of the same material.

9. The method according to claim 1, further comprising depositing a dielectric material layer over the second material layer.

10. The method according to claim 9, further comprising depositing a conductive material layer over the dielectric material layer.

11. The method according to claim 1, wherein depositing a discontinuous first material layer on a substrate further includes depositing the nonconductive discontinuous first layer on a substrate of borophosphosilicate glass.

12. The method according to claim 1, wherein depositing a substantially continuous second material layer further includes depositing a substantially continuous layer of conductive material.

13. A method of forming a capacitor storage node, the method comprising:
    depositing a nonconductive discontinuous first material layer on a substrate so as to define at least one area through which the substrate is exposed;
    depositing a second material layer over the nonconductive discontinuous first material layer and the at least one area through which the substrate is exposed such that the second material layer exhibits a first thickness over the nonconductive discontinuous first material layer and a second, lesser thickness over the at least one area through which the substrate is exposed.

14. The method according to claim 13, wherein depositing a nonconductive discontinuous first material layer includes collimated sputtering.

15. The method according to claim 14, wherein the collimated sputtering further includes defining a collimator ratio to be less than approximately 3:1.

16. The method according to claim 13, wherein depositing a nonconductive discontinuous first material layer includes chemical vapor deposition of the nonconductive discontinuous first material layer.

17. The method according to claim 13, wherein depositing a second material layer includes depositing a conductive material layer.

18. The method according to claim 13, further comprising depositing a dielectric material layer over the second material layer.

19. The method according to claim 18, further comprising depositing a conductive material layer over the dielectric material layer.

20. The method according to claim 13, wherein depositing a second material layer includes depositing a conductive material layer.

* * * * *